United States Patent
Yang et al.

(10) Patent No.: US 11,462,551 B2
(45) Date of Patent: Oct. 4, 2022

(54) MEMORY DEVICE

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Xiu-Li Yang, Shanghai (CN); He-Zhou Wan, Shanghai (CN); Yan-Bo Song, Shanghai (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 17/225,774

(22) Filed: Apr. 8, 2021

(65) Prior Publication Data
US 2022/0189971 A1    Jun. 16, 2022

(30) Foreign Application Priority Data
Dec. 14, 2020   (CN) .......................... 202011468190.1

(51) Int. Cl.
*G11C 11/418*    (2006.01)
*H01L 27/11*    (2006.01)

(52) U.S. Cl.
CPC ........ *H01L 27/1116* (2013.01); *G11C 11/418* (2013.01); *H01L 27/1104* (2013.01)

(58) Field of Classification Search
CPC . H01L 27/1116; H01L 27/1104; G11C 11/418
(Continued)

(56) References Cited

U.S. PATENT DOCUMENTS 4,849,904 A    7/1989   Aipperspach et al.
4,926,384 A    5/1990   Roy
(Continued)

FOREIGN PATENT DOCUMENTS

KR    20190125836 A    11/2019
KR    20200030599 A    3/2020
(Continued)

OTHER PUBLICATIONS

Wang, K. et al., "A 21ns 32Kx8 CMOS SRAM with a Selectively Pumped P-Well Array" 1987 IEEE International Solid-State Circuits Conference, p. 254-p. 255.

*Primary Examiner* — Michael T Tran
(74) *Attorney, Agent, or Firm* — Maschoff Brennan

(57)    ABSTRACT

A memory device includes a first isolation cell, a first memory array of a first memory segment, a second memory array of a second memory segment, a first decoder cell of the first memory segment and a second decoder cell of the second memory segment. The first isolation cell extends in a first direction. The first memory array of the first memory segment abuts a first boundary of the first isolation cell in a second direction different from the first direction. The second memory array of the second memory segment abuts a second boundary, opposite to the first boundary, of the first isolation cell in the second direction. The first decoder cell of the first memory segment and the second decoder cell of the second memory segment are arranged on opposite sides of the first isolation cell.

20 Claims, 12 Drawing Sheets

(58) Field of Classification Search
USPC .......................................... 365/154, 189.05
See application file for complete search history.

(56) References Cited

U.S. PATENT DOCUMENTS

| | | | | |
|---|---|---|---|---|
| 5,744,844 A * | 4/1998 | Higuchi | ............... | H01L 27/1104 365/189.11 |
| 5,862,073 A * | 1/1999 | Yeh | .................... | G11C 16/0416 365/185.01 |
| 5,894,448 A * | 4/1999 | Amano | ................. | G11C 5/025 365/230.08 |
| 6,023,437 A * | 2/2000 | Lee | ....................... | G11C 7/1048 365/230.03 |
| 6,269,017 B1 * | 7/2001 | Lu | ....................... | G11C 11/5692 257/E27.102 |
| 7,289,373 B1 * | 10/2007 | Son | ........................ | G11C 7/067 365/189.02 |
| 9,892,782 B1 * | 2/2018 | Nagey | .................... | H03M 1/685 |
| 2001/0017813 A1 * | 8/2001 | Uchida | .................... | G11C 8/08 365/230.06 |
| 2002/0001242 A1 | 1/2002 | Ferrant et al. | | |
| 2002/0176296 A1 * | 11/2002 | Chen | .................... | G11C 29/812 365/201 |
| 2005/0232035 A1 | 10/2005 | Miyakawa et al. | | |
| 2007/0029622 A1 * | 2/2007 | Park | .................. | H01L 27/11526 257/374 |
| 2009/0235171 A1 | 9/2009 | Adams et al. | | |
| 2010/0091537 A1 * | 4/2010 | Best | ....................... | G11C 11/406 365/220 |
| 2015/0003141 A1 | 1/2015 | Son et al. | | |
| 2015/0262636 A1 * | 9/2015 | Tanzawa | .................. | G11C 7/18 365/189.011 |
| 2016/0133321 A1 * | 5/2016 | Nagey | .................... | G11C 11/16 365/148 |
| 2017/0236565 A1 * | 8/2017 | Tiwari | .................... | G11C 8/04 365/189.05 |
| 2019/0057734 A1 * | 2/2019 | Onuki | .................... | G11C 11/401 |
| 2019/0180812 A1 * | 6/2019 | Sung | .................... | G11C 11/4094 |
| 2019/0333547 A1 | 10/2019 | Ka | | |
| 2019/0392877 A1 * | 12/2019 | Kawamura | ......... | G11C 11/4094 |
| 2020/0350320 A1 * | 11/2020 | Cheng | ............... | H01L 27/10894 |
| 2021/0181979 A1 * | 6/2021 | Choi | .................... | G11C 13/003 |

FOREIGN PATENT DOCUMENTS

| | | |
|---|---|---|
| TW | 200627477 A | 8/2006 |
| TW | 201631599 A | 9/2016 |
| WO | 2019050625 A | 3/2019 |

* cited by examiner

MEMORY DEVICE

CROSS REFERENCE

The present application claims priority to China Application Serial Number 202011468190.1 filed on Dec. 14, 2020, which is herein incorporated by reference in its entirety.

BACKGROUND

In the semiconductor industry, the read/write word line segment design has been widely utilized in products of low control voltage (VCCmin) and that demanding low power consumption. In some advanced manufacturing processes, the floor plan of multiple word line segments loses a large amount of area due to necessary blank spaces between the memory array and the logic circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
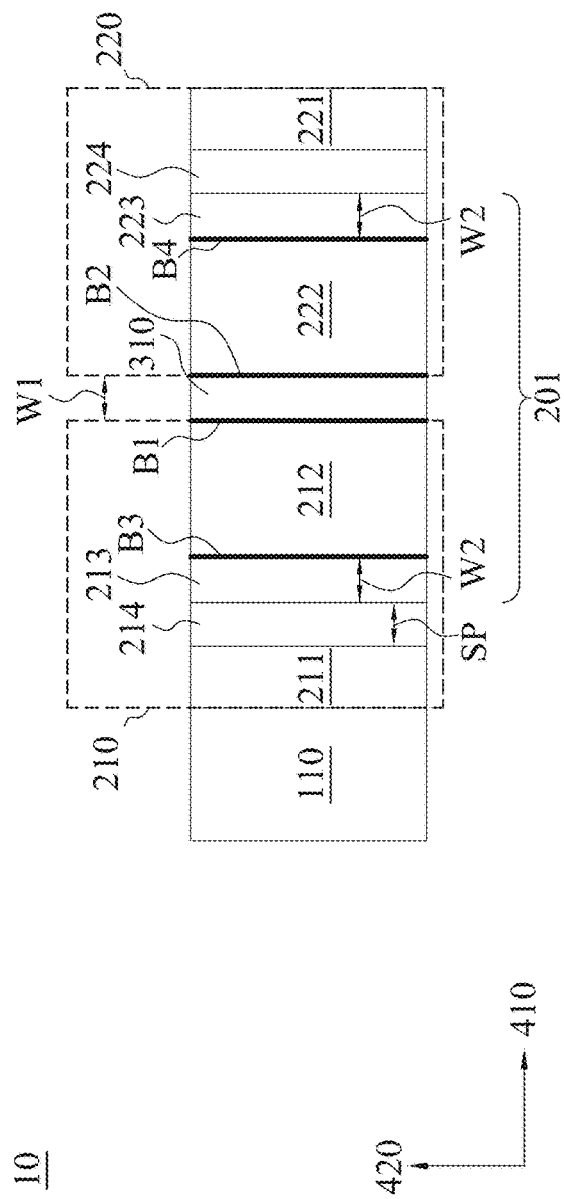
FIG. 1 is a schematic diagram of a floor plan of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a floor plan of a memory device 10, in accordance with some embodiments. As shown in FIG. 1, the memory device 10 includes a word line decoder 110, memory segments 210-220 and an isolation cell 310. In some embodiments, the word line decoder 110 in a floor plan is also referred to as being configured in the word line decoder cell 110. For illustration, the memory segments 210-220 abut the word line decoder cell 110 in the direction 410. The isolation cell 310 extends in the direction 420, and is configured to be sandwiched between two adjacent the memory segments 210-220. Alternatively stated, the memory segments 210-220 are arranged, with respect to the isolation cell 310, in a mirror configuration. In some embodiments, one of the memory segments 210-220 is configured to be activated in response to a word line signal transmitted from the word line decoder 110. The detailed operational configurations of the memory device 10 will be discussed in the following paragraph with reference to FIGS. 2A-2B.

In some embodiments, the memory segment 210 includes a decoder 211, a memory array 212, an edge cell array 213. Similarly, the memory segment 220 includes a decoder 221, a memory array 222, an edge cell array 223. In some embodiments, the decoder 211 in a floor plan is also referred to as being configured in the decoder cell 211. In some embodiments, the decoder 221 in a floor plan is also referred to as being configured in the decoder cell 221.

In some embodiments, the memory arrays 212, 222, the edge cell arrays 213, 223, and the isolation cell 310 include static random access memory cells (SRAM cells), for example, SRAM cells including 6 transistors (6T). Nevertheless, other kinds of SRAM cells including a different number of transistors are utilized simply in various embodiments, for example, 8T SRAM, 10T SRAM. In some embodiments, memory cells in the memory arrays 212, 222, the edge cell arrays 213, 223, and the isolation cell 310 have identical structural configurations and are manufactured by the same mask or in the same mask process. The difference lies on the fact that memory cells in the edge cell arrays 213, 223 and the isolation cell 310 are referred to as dummy memory cells and do not electrically operate or function in the memory device 10.

As shown in FIG. 1, the memory array 212 abuts a boundary B1 of the isolation cell 310 in the direction 410, and the memory array 222 abuts a boundary B2, different from the boundary B1, of the isolation cell 310 in the direction 410. Moreover, the edge cell array 213 abuts a boundary B3, opposite to the isolation cell 310, of the memory array 212, and the edge cell array 223 abuts a boundary B4, opposite to the isolation cell 310, of the memory array 222.

In the floor plan, the isolation cell 310 has a width W1. The edge cell arrays 213 and 223 have a width W2. In some embodiments, the isolation cell 310 includes edge cells the same as those in the edge cell arrays 213 and 223. In some embodiments, the isolation cell 310 includes a number N of edge cell arrays, in which the number N is a positive integer. For example, when the isolation cell 310 includes one columns of edge cell array, the width W1 equals the width W2. In various embodiments, when the isolation cell 310 includes more than one columns of edge cell arrays, the width W1 is greater than the width W2. The detailed floor plan will be discussed in FIG. 3A.

In some embodiments, the memory arrays 212, 222 and the edge cell arrays 213, 223 are included in the memory bank 201, as shown in FIG. 1. In the meantime, in the floor plan, the decoder cells 211 and 221 are arranged outside of the memory bank 201. Alternatively stated, the decoder cells 211, 221 are arranged on the opposite sides of the isolation cell 310.

As shown in FIG. 1, the memory bank 201 is separated from the decoder cells (i.e., logic circuits) 211 and 221 by blank spaces 214 and 224 respectively. In some embodiments, the blank spaces 214 and 224 have a width SP being approximate 0.2 micrometers.

In some approaches, edge cell arrays are required to be disposed on two edges of memory arrays in a memory device. Moreover, blank spaces are needed to separate the edge cell arrays on two sides from adjacent other logic circuits. Alternatively stated, between each memory array and logic circuits close by are at least two columns of edge cell arrays and two portions of blank spaces. Accordingly, there are at least four columns of edge cell arrays and four portions of blank spaces between two memory segments and adjacent logic circuits. Based on the above, the memory device losses a massive amount of area, and accordingly, the size and manufacturing cost of products climb.

Compared with the approaches above, with the configurations of the present disclosure, the isolation cell is utilized to separate two adjacent memory arrays. Edge cell arrays are arranged on boundaries, opposite to the isolation cell, of the two memory arrays. Accordingly, the edge cell arrays for two adjacent memory segments and logic circuits close by reduce to two columns. The blank spaces also decline to two portion. The efficiency of area in the memory device increases, and accordingly, it cuts the sizes of the products and the manufacturing cost.

The configurations of FIG. 1 are given for illustrative purposes. Various implements are within the contemplated scope of the present disclosure. For example, in some embodiments, the memory device 10 also includes multiple edge cells abutting the memory arrays 212 and 222 in the direction 420.

Figure 2A:
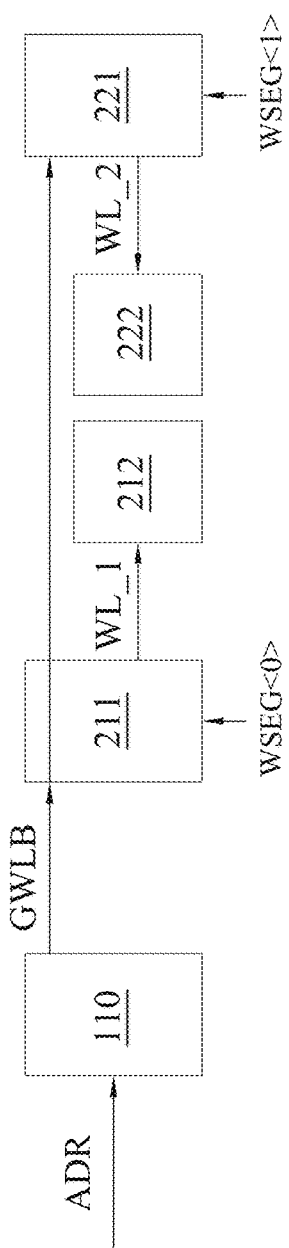
FIG. 2A is a schematic circuit diagram of a memory device, in accordance with various embodiments.

Reference is now made to FIG. 2A. FIG. 2A is a schematic circuit diagram of the memory device 10, in accordance with various embodiments. With respect to the embodiments of FIG. 1, like elements in FIG. 2A are designated with the same reference numbers for ease of understanding.

As shown in FIG. 2A, the word line decoder 110 is configured to receive an address ADR, and to decode, in response to the address ADR, a word line GWLB. In some embodiments, the address ADR includes several bits, and indicates that in the memory bank 201 one word line which is coupled to a certain row of memory cells should be activated correspondingly. The word line signal GWLB is transmitted to the decoders 211 and 221. Subsequently, the decoder 211 generates, in accordance with the word line signal GWLB and a word line segment selection signal WSEG<0>, a word line signal WL_1 to the memory array 212. Similarly, the decoder 221 generates, in accordance with the word line signal GWLB and a word line segment selection signal WSEG<1>, a word line signal WL_2 to the memory array 212.

Figure 2B:
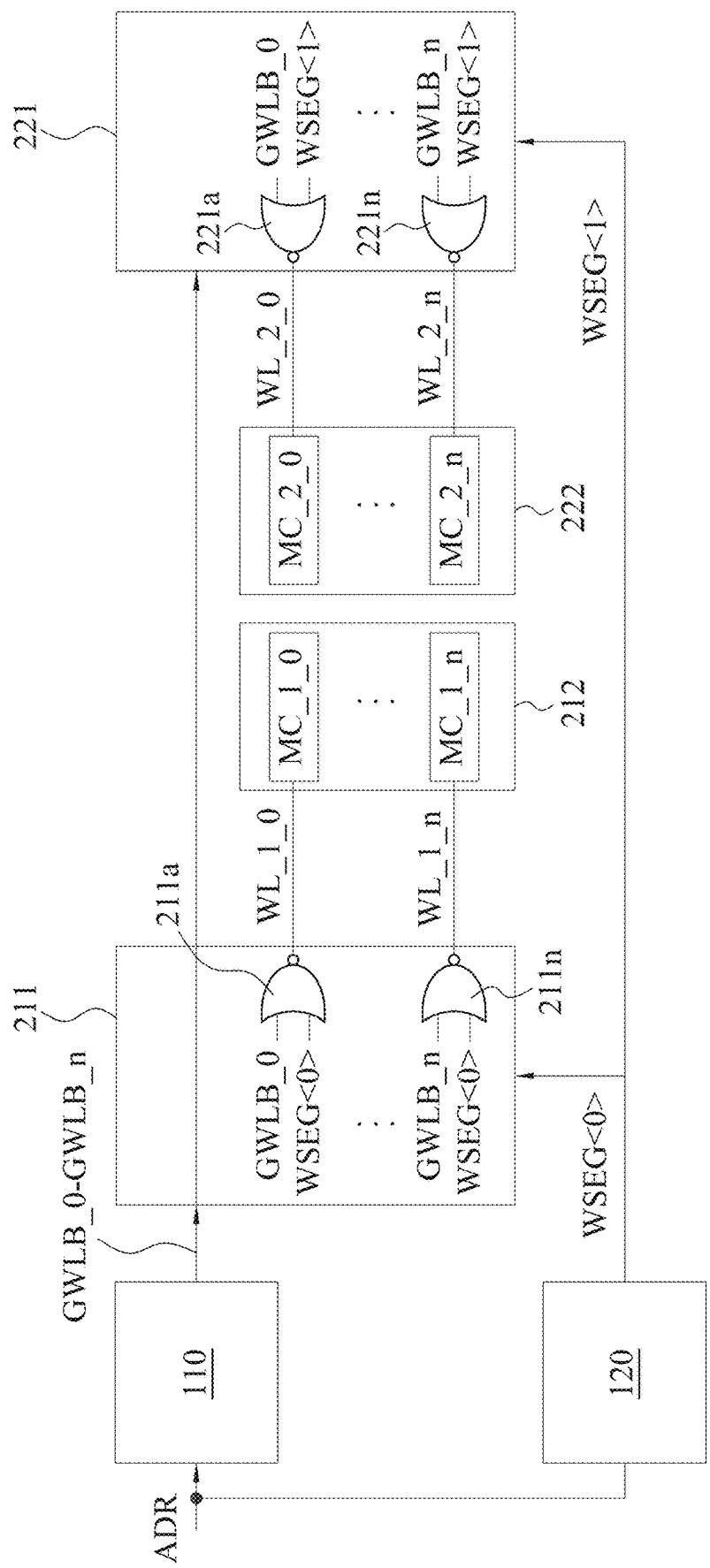
FIG. 2B is a schematic circuit diagram of the memory device of FIG. 2A, in accordance with various embodiments.

Reference is now made to FIG. 2B. FIG. 2B is a schematic circuit diagram of the memory device 10 of FIG. 2A, in accordance with various embodiments. With respect to the embodiments of FIGS. 1-2A, like elements in FIG. 2B are designated with the same reference numbers for ease of understanding.

Specifically, the word line decoder 110 transmits the word line signal GWLB to the decoders 211 and 221 through (n+1) word lines GWLB_0-GWLB_n, in which the number $n$ indicates that memory cells in the memory device 10 are arranged in (n+1) rows. For example, the word line signal GWLB includes (n+1) word line signals that correspond to, separately, memory cells arranged in (n+1) rows. For the sake of simplicity, aforementioned word lines are denoted with GWLB_0-GWLB_n.

Subsequently, in some embodiments, the memory device 10 further includes a word line selection decoder 120. The word line selection decoder 120 is configured to receive the address ADR for decoding and to generate the word line segment selection signals WSEG<0> and WSEG<1>. For example, when the word line selection decoder 120 decodes the address ADR indicating that the assigned memory cell to be activated is located in the memory array 212, the word line segment selection signal WSEG<0> has a logic 0 and the word line segment selection signal WSEG<1> has a logic 1. In contrast, when the word line selection decoder 120 decodes the address ADR indicating that the assigned memory cell to be activated is located in the memory array 222, the word line segment selection signal WSEG<0> has the logic 1 and the word line segment selection signal WSEG<1> has the logic 0.

As shown in FIG. 2B, the decoder 211 includes logic gates 211a-211n. In some embodiments, the logic gates 211a-211n include NOR gate. A first terminal of the logic gate 211a receives the word line signal GWLB_0 and a second terminal thereof receives the word line segment selection signal WSEG<0>, and a word line signal WL_1_0 (i.e., referred as the word line signal transmitted in the WL_1_0) is generated at an output terminal to the memory cell MC_1_0 in the memory array 212. Accordingly, when the word line signal GWLB_0 has the logic 0 and the word line segment selection signal WSEG<0> has the logic 0, the memory cell MC_1_0 is activated. For the sake of simplicity, the illustrated the memory device 10 has memory cells arranged in a row. In the various embodiments of the present disclosure, the memory device 10 has memory cells arranged in multiple rows, and the memory cells are coupled to multiple bit lines/bit lines bar (not shown), in which column decoder(s) (not shown) is configured to select memory cell(s) in the same column for write or read operation. The configurations of the decoder 221 and the memory array 222 are similar to that of the decoder 211 and the memory array 212. Hence, the repetitious descriptions are omitted here.

The configurations of FIGS. 2A-2B are given for illustrative purposes. Various implements are within the contemplated scope of the present disclosure. For example, in some embodiments, the word line selection decoder 120 is integrated in a main control circuit (i.e., the main control circuit 720 of FIG. 8) or in the word line decoder 110.

Figure 3A:
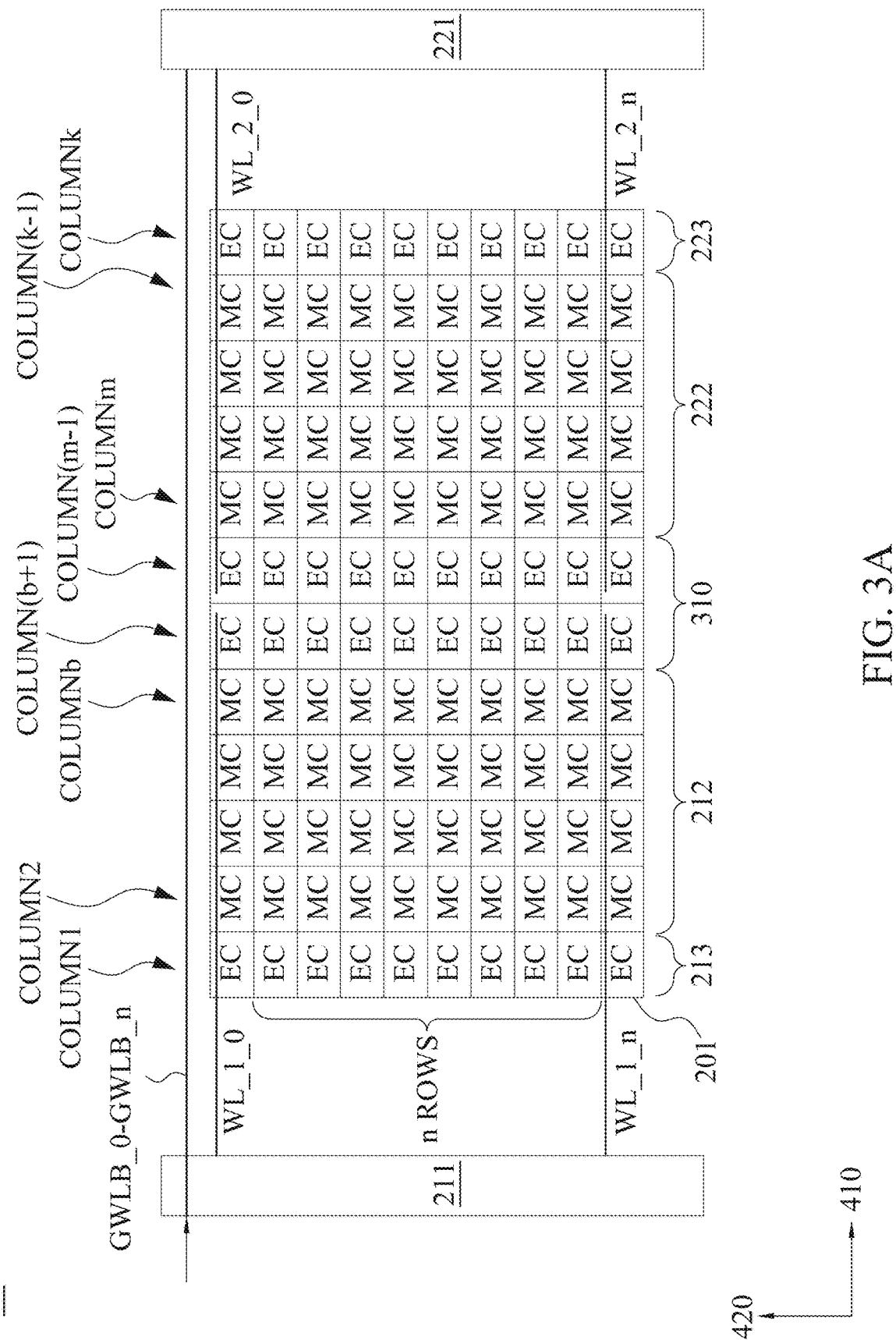
FIG. 3A is floor plan diagram corresponding to the memory device in FIG. 1, in accordance with some embodiments.

Reference is now made to FIG. 3A. FIG. 3A is floor plan diagram corresponding to the memory device 10 in FIG. 1, in accordance with some embodiments. As shown in the embodiments of FIG. 3A, the memory bank 201 includes memory cells MC and edge cells EC that are arranged in memory columns COLUMN1-COLUMNk and n rows.

Specifically, the edge cells EC included the edge cell array 213 are arranged in the memory column COLUMN1, in which the memory column COLUMN1 is referred as an edge column in the memory columns COLUMN1-COLUMNk.

Subsequently, the memory cells MC included in the memory array 212 are arranged in the memory columns COLUMN2-COLUMNb, in which the memory columns COLUMN2-COLUMNb are referred to as a first group of the memory columns in the memory columns COLUMN1-COLUMNk. Alternatively stated, the memory column COLUMN2, referred as an edge column of the first group of the memory columns, abuts the memory column COLUMN1 referred as the edge column in the memory columns COLUMN1-COLUMNk.

The edge cells EC included in the isolation cell 310 are arranged in the memory columns COLUMN(b+1)-COLUMN(m−1). The memory columns COLUMN(b+1)-COLUMN(m−1) are referred to as a second group of the memory columns in the memory column COLUMN1-COLUMNk. Alternatively stated, the memory column COLUMN(b+1), referred as an edge column of the second group of the memory columns, abuts the memory column COLUMNb referred as another edge column in the first group of the memory columns.

The memory cells MC included in the memory array 222 are arranged in the memory column COLUMNm-COLUMN(k−1). The memory columns COLUMNm-COLUMN(k−1) are referred to as a third group of the memory columns COLUMN1-COLUMNk. Alternatively stated, the memory column COLUMNm, referred as an edge column of the third group of the memory columns, abuts the memory column COLUMN(m−1) referred as another edge column in the third group of the memory columns.

The edge cells EC included in the edge cell array 223 are arranged in the memory column COLUMNk. The memory column COLUMNk is referred to as another edge column in the memory column COLUMN1-COLUMNk. Alternatively stated, the memory column COLUMN(k−1), referred as another edge column of the third group of the memory columns, abuts the memory column COLUMNk referred as another edge column in the memory columns COLUMN1-COLUMNk.

As aforementioned above, in the embodiments of FIG. 3A, with respect to the edge cells EC in the isolation cell 310, the edge cells included in the edge cell array 213 and the memory cells MC included in the memory array 212 are in the mirror configurations of the edge cells EC included in the edge cell array 223 and the memory cells MC included in the memory array 222.

In some embodiments, the memory array 212 correspond to (b−1) bits, and the memory array 222 correspond to (k−m+1) bits.

With continued reference to FIG. 3A, the word lines WL_1_0-WL_1_n, coupled to the decoder 211 and the memory cells MC in the memory array 212, extend in the direction 410, and are terminated at the isolation cell 310. Similarly, the word lines WL_2_0-WL_2, coupled to the decoder 221 and the memory cells MC in the memory array 222, extend in the direction 410, and are terminated at the isolation cell 310. Alternatively stated, the word lines WL_1_0-WL_1_n and WL_2_0-WL_2_n are terminated at the second group of the memory columns (i.e., the memory columns COLUMN(b+1)-COLUMN(m−1)). Meanwhile, as shown in FIG. 3A, the word lines WL_1_0-WL_1_n and WL_2_0-WL_2_n that are included in two adjacent memory segments 210-220 are arranged between the decoders 211-221. For the sake of simplicity, only word lines WL_1_0, WL_1_n, WL_2_0, and WL_2_n are illustrated in the figure.

In some embodiments, during operation, the decoder 211 is configured to transmit the word lines signal WL_1_0-WL_1_n in the word lines WL_1_0-WL_1_n from a first side of the memory bank 201 to activate one of the memory cells MC in the memory array 212. Similarly, the decoder 221 is configured to transmit the word lines signal WL_2_0-WL_2_n in the word lines WL_2_0-WL_2_n from a second side, opposite to the first side, of the memory bank 201 to activate one of the memory cells MC in the memory array 222.

Figure 3B:
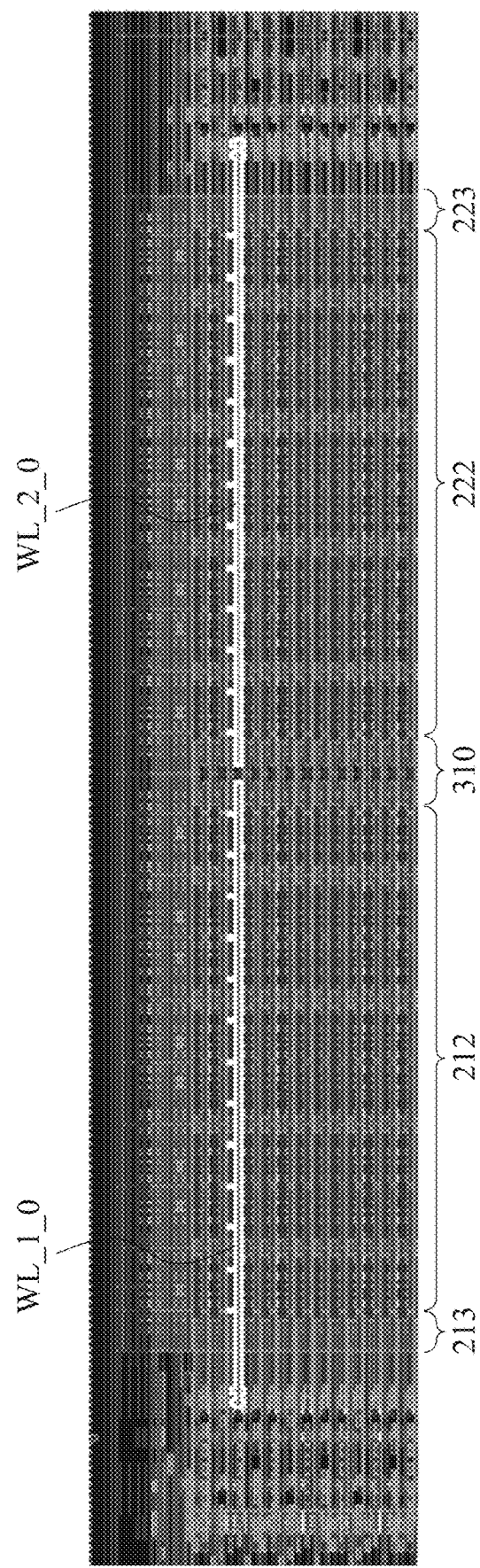
FIG. 3B is floor plan diagram corresponding to the memory device in FIG. 3A, in accordance with some embodiments.

Reference is now made to FIG. 3B. FIG. 3B is floor plan diagram corresponding to the memory device 10 in FIG. 3A, in accordance with some embodiments. With respect to the embodiments of FIGS. 1-3A, like elements in FIG. 3B are designated with the same reference numbers for ease of understanding. For the sake of simplicity, only word lines WL_1_0 and WL_2_0 are illustrated in FIG. 3B, while other word lines are omitted therein. As an illustration, in the memory device 10, the word lines WL_1_0 and WL_2_0 disposed in the same row extend in a row direction of the memory device 10. The word lines WL_1_0 and WL_2_0 are separated from each other and terminated at the isolation cell 310 that is sandwiched between the memory array 212 and 222. Alternatively stated, as shown in FIG. 3B, the word lines WL_1_0 and WL_2_0 are terminated between the edge cell arrays 213 and 223. Furthermore, in some embodiments, the isolation cell 310 occupies an area twice the size of an area of the edge cell array 213 or 223. Alternatively stated, as discussed above regarding FIG. 1, the width W1 of the isolation cell 310 is about twice of the value of the width W2 of the edge cell array 213 or 223. Moreover, in some embodiments, area occupied by each of the memory arrays 212 and 222 is significantly greater than that of the isolation cell 310 and that of the edge cell arrays 213 and 223, as shown in FIG. 3B.

The configurations of FIGS. 3A-3B are given for illustrative purposes. Various implements are within the contemplated scope of the present disclosure. For example, in some embodiments, the edge cells EC included in the edge cell arrays 213 and 223 are arranged in more than one memory columns.

Figure 4:
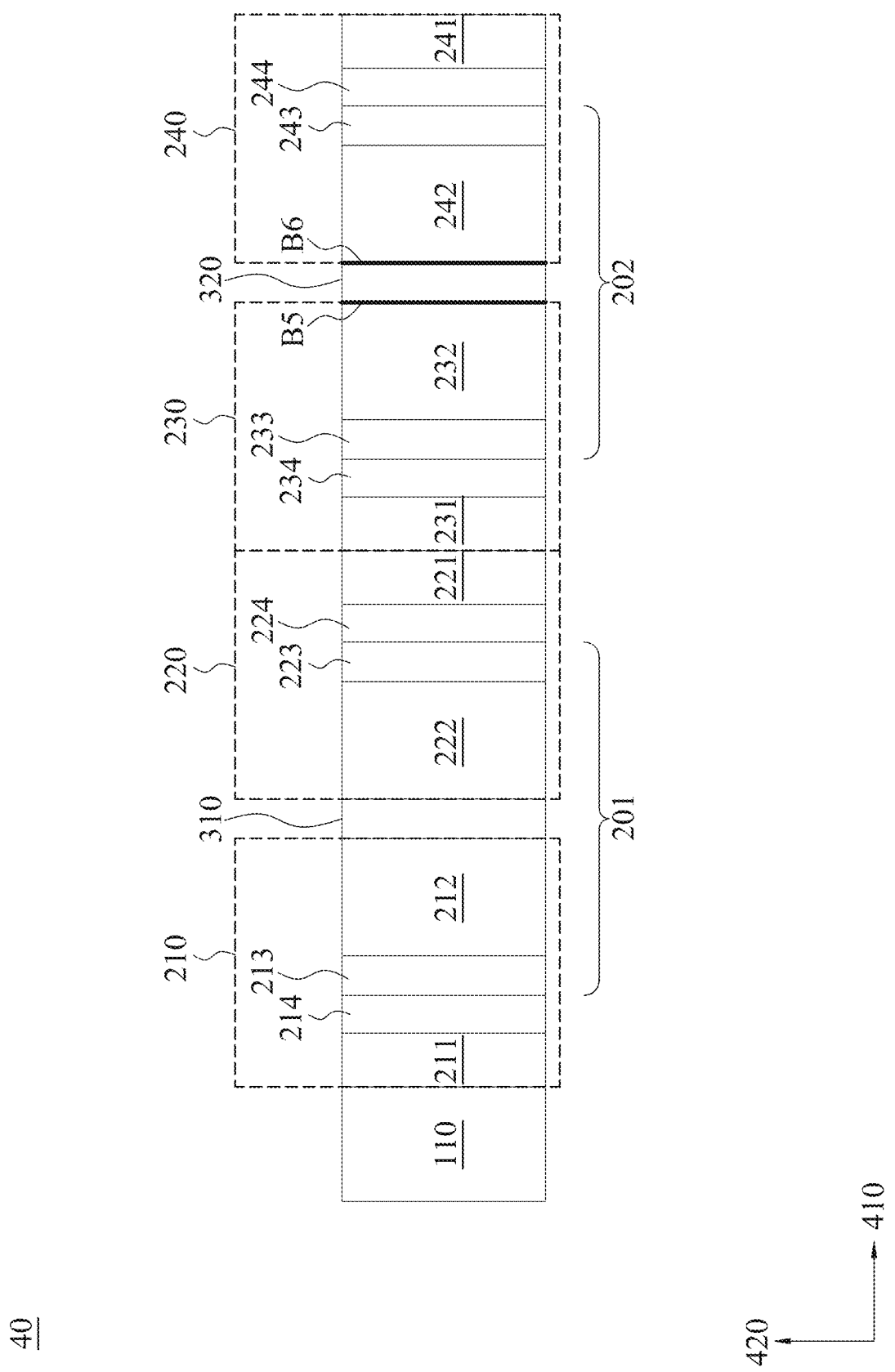
FIG. 4 is a schematic diagram of a floor plan of a memory device, in accordance with some embodiments.

Reference is now made to FIG. 4. FIG. 4 is a schematic diagram of a floor plan of a memory device 40, in accordance with some embodiments. With respect to the embodiments of FIGS. 1-3B, like elements in FIG. 4 are designated with the same reference numbers for ease of understanding.

Compared with FIG. 1, the memory device 40 further includes memory segments 230-240 and an isolation cell 320. In some embodiments, the memory segment 230 is configured with respect to, for example, the memory segment 210. The memory segment 240 is configured with respect to, for example, the memory segment 220. The isolation cell 320 is configured with respect to, for example, the isolation cell 310. As shown in FIG. 4, the memory segment 230 includes a decoder 231 (i.e., also being referred to as being configured in the decoder cell 231), a memory array 232, an edge cell array 233, and a blank space 234 arranged between the decoder 231 and the edge cell array 233. Similarly, the memory segment 240 includes a decoder 241 (i.e., also being referred to as being configured in the decoder cell 241), a memory array 242, an edge cell array 243 and a blank space 244 arranged between the decoder 241 and the edge cell array 243. In some embodiments, the memory arrays 232, 242 and the edge cell arrays 233, 243 are included in the memory bank 202.

The isolation cell 320 is arranged sandwiched between the memory segments 230-240. Specifically, the isolation cell 320 is arranged abutting and between the memory arrays 232 and 242. Alternatively stated, the memory array 232 abuts a boundary B5 of the isolation cell 320 and the memory array 242 abuts a boundary B6 of the isolation cell 320.

In addition, the decoder cells 231 and 241 are arranged on the opposite sides of the isolation cell 320. Meanwhile, as shown in FIG. 4, the decoder cell 231 abuts the decoder cell 221 in the direction 410. Alternatively stated, in addition to the adjacent memory segments 210-220 sandwiching the isolation cell 310, the decoder cell 231 abuts the decoder cell 221, in which the decoder cell 231 is included in the memory segment 230 abutting the memory segment 220 and the decoder cell 221 is included in the memory segment 220. To state in another way, the decoder cells 221 and 231 are also arranged between the edge cell arrays 223 and 233.

The configurations of FIG. 4 are given for illustrative purposes. Various implements are within the contemplated scope of the present disclosure. For example, in some embodiments, the memory device 40 includes multiple memory banks with the configurations of the memory bank 201-202 as shown in FIG. 4.

Figure 5:
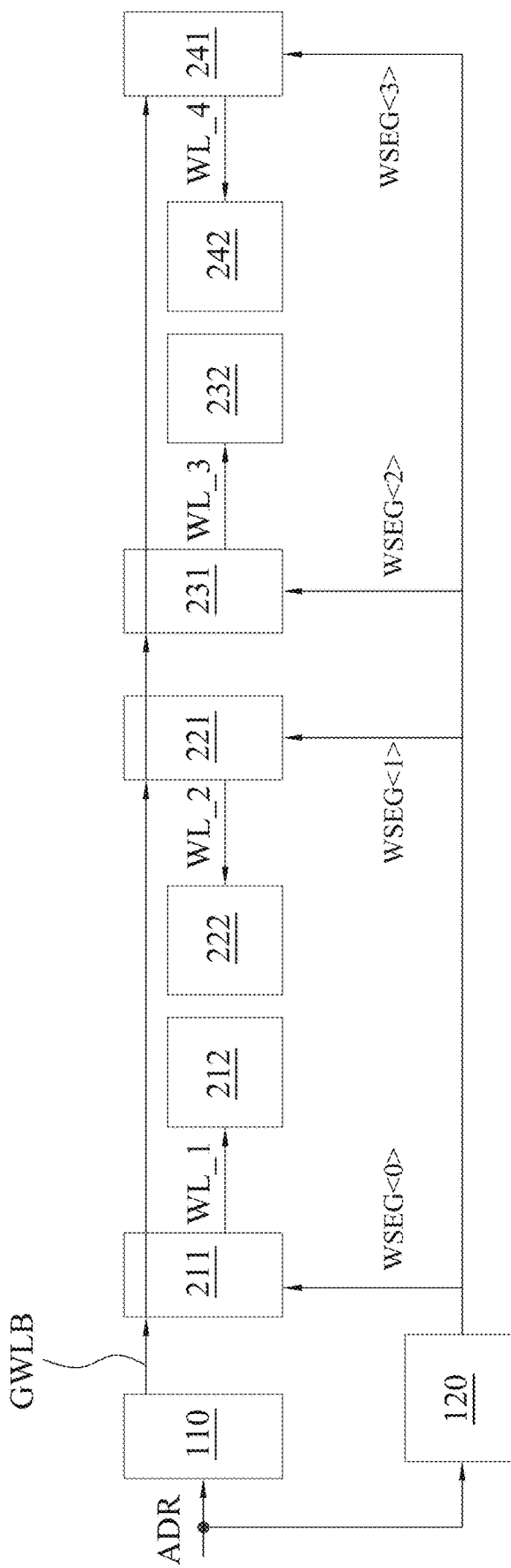
FIG. 5 is a schematic circuit diagram of the memory device of FIG. 4, in accordance with various embodiments.

Reference is now made to FIG. 5. FIG. 5 is a schematic circuit diagram of the memory device 40 of FIG. 4, in accordance with various embodiments. Compared with FIG. 2B, the word line selection decoder 120 is further configured to decode, in response to the address ADR, to generate and transmit word line segment selection signals WSEG<2> and WSEG<3> to the decoders 231 and 241 respectively. For example, when the word line selection decoder 120 decodes the address ADR indicating that the assigned memory cell to be activated is located in the memory array 232, the word line segment selection signal WSEG<2> has the logic 0 and the word line segment selection signals WSEG<0>, WSEG<1>, WSEG<3> have the logic 1; and the like. The repetitious descriptions are omitted here.

Figure 6:
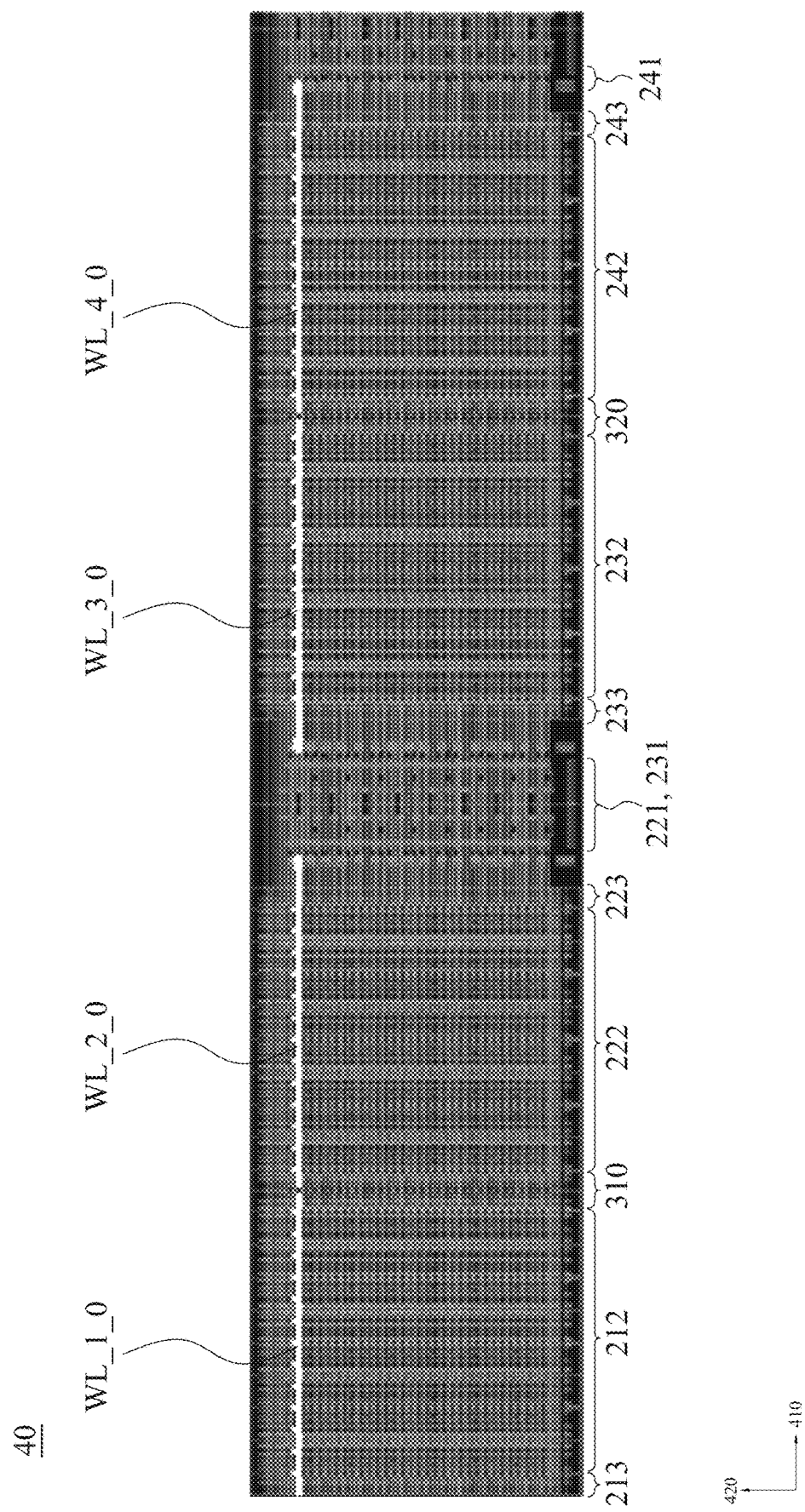
FIG. 6 is a floor plan diagram corresponding to the memory device of FIG. 4, in accordance with various embodiments.

Reference is now made to FIG. 6. FIG. 6 is a floor plan diagram corresponding to the memory device 40 of FIG. 4, in accordance with various embodiments. With respect to the embodiments of FIGS. 4-5, like elements in FIG. 6 are designated with the same reference numbers for ease of understanding. For illustration, in the memory device 40, the decoder cells 221 and 231 abut each other and are arranged between the edge cell arrays 223 and 233. Alternatively stated, the decoder cells 221 and 231 are arranged back-to-back with each other.

Moreover, in some embodiments, the decoder cells 221 and 231 transmit word line signals in opposite directions, such like in negative direction 410 and in positive direction 410. Specifically, as shown in FIG. 6, the memory device 40 includes word lines WL_1_0-WL_4_0 corresponding to, separately, word lines that transmit the word line signals WL_1-WL4 in FIG. 5 to the memory arrays 212, 222, 232, and 242. The word line WL_2_0 is coupled to the decoder cell 221 and the decoder cell 221 transmits the word line signal to the memory array 222 through the word line WL_2_0 in negative direction 410; whereas the word line WL_3_0 is coupled to the decoder cell 231 and the decoder cell 231 transmits the word line signal to the memory array 232 through the word line WL_3_0 in positive direction 410.

Figure 7:
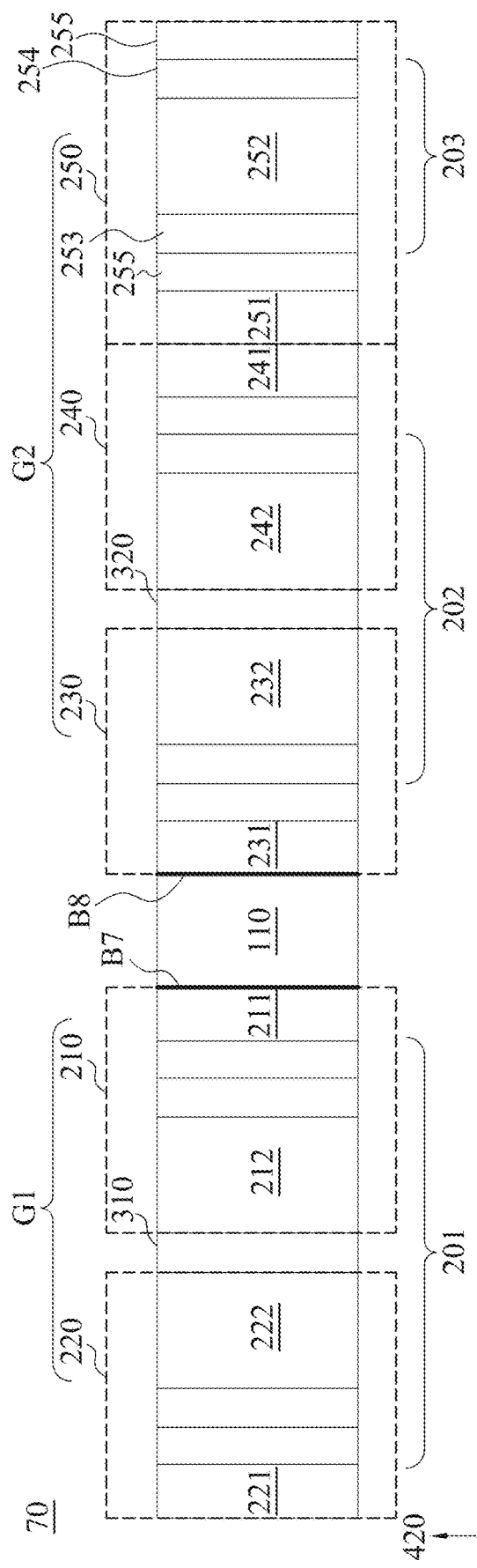
FIG. 7 is a schematic diagram of a floor plan of a memory device, in accordance with some embodiments.

Reference is now made to FIG. 7. FIG. 7 is a schematic diagram of a floor plan of a memory device 70, in accordance with some embodiments. With respect to the embodiments of FIGS. 1-6, like elements in FIG. 7 are designated with the same reference numbers for ease of understanding.

Compare with FIG. 4, instead of the word line decoder 110 being arranged on a same side of the memory segments 210-240, the word line decoder cell 110 in the memory device 70 is arranged between the memory segments 210 and 230. Alternatively stated, with respect to the word line decoder cell 110, the memory bank 201-202 are symmetric with each other. Specifically, as shown in FIG. 7, the decoder cell 211 abuts a boundary B7 of the word line decoder cell 110, and the decoder cell 231 abuts a boundary B8 of the word line decoder cell 110. Alternatively stated, the decoder cells 211 and 231 abut the opposite boundaries B7-B8 of the word line decoder cell 110.

Moreover, the memory device 70 further includes a memory segment 250 abutting the memory segment 240. The memory segment 250 includes a decoder 251, a memory array 252, edge cell arrays 253, 254 arranged on two sides of the memory array 252, and blank space 255. As shown in FIG. 7, the decoder cells 241 and 251 abut each other and are arranged between the memory arrays 242 and 252.

In some embodiments, the memory segments 210-220 are referred to as a first group G1, and the memory segments 230-250 are referred to as a second group G2. The first group is arranged on a side of the word line decoder cell 110, and the second group G2 is arranged on the other side of the word line decoder cell 110. As shown in FIG. 7, a number of the memory segments included in the first group G1 and a number of the memory segments included in the second group G2 are different from each other. Specifically, the number of the memory segments included in the first group G1 is an even number, and the number of the memory segments included in the second group G2 is an add number.

In some embodiments, the memory device 70 further includes another memory segment which is combined with the memory segment 250 to have the same configuration as that of the memory segments 210-220. Accordingly, the memory bank 203 has the same configurations as the memory bank 202 does.

In various embodiments, there are a plurality of groups of memory segments with the same configurations arranged on two sides of the word line decoder cell 110, such as groups of the memory segments 210 and 220.

As mentioned above, in some approaches, each memory segment needs to include at least two edge cell arrays and blank spaces. Accordingly, when the memory device includes tons of the memory segments, area loss caused by non-memory components correspondingly rises. In contrast, with the configurations of the present disclosure, when the memory device includes massive amount of memory segments, area loss caused by non-memory components correspondingly is reduced. For example, in some approaches, a memory device includes 8 memory segments having 64 rows and 64 columns, occupying an area of approximate 855 square micrometers. But it merely occupies about 817 square micrometers by utilizing the configurations of the present disclosure, reducing about 5% of area. Given another example, in some approaches, a memory device includes 12 memory segments having 512 rows and 48 columns, occupying an area of approximate 5211.8 square micrometers. But it merely occupies about 4887.6 square micrometers by utilizing the configurations of the present disclosure, reducing about 7% of area.

Furthermore, in some approaches, a memory device, for example, includes 12 memory segments having 512 rows and 48 columns. It violates the IC layout design rules as one memory segment includes 4 memory columns. On the contrary, with the configurations of the present disclosure, due to the decline of area occupied by the total memory banks, one memory segment can include four memory columns while the IC layout design rules are fulfilled. Accordingly, the flexibility in the memory device floor plan is significantly improved.

The configurations of FIG. 7 are given for illustrative purposes. Various implements are within the contemplated scope of the present disclosure. For example, in some embodiments, both of the number of the memory segments included in the first group G1 and the number of the memory segments included in the second group G2 are odd number or even number. In various embodiments, the number of the memory segments included in the first group G1 and the number of the memory segments included in the second group G2 are the same.

Figure 8:
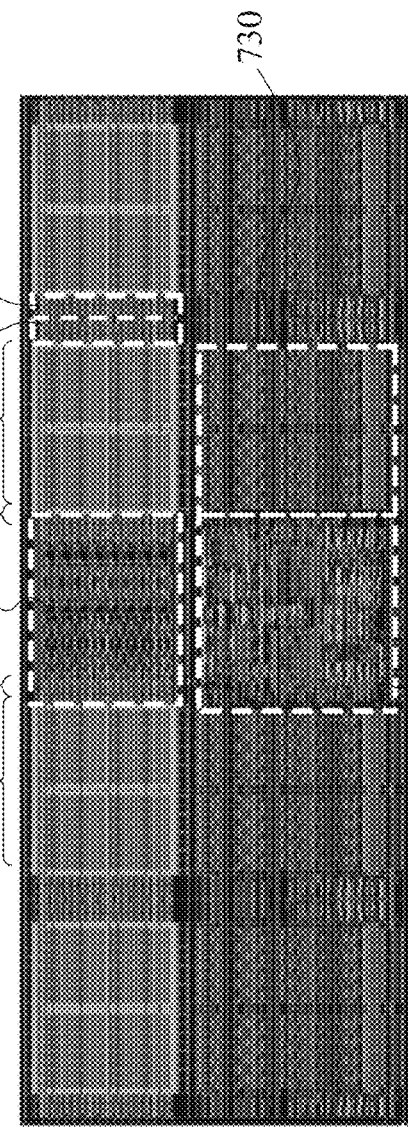
FIG. 8 is a schematic diagram of a floor plan of a memory device, in accordance with some embodiments.

Reference is now made to FIG. 8. FIG. 8 is a schematic diagram of a floor plan of a memory device 80, in accordance with some embodiments. With respect to the embodiments of FIGS. 1-7, like elements in FIG. 8 are designated with the same reference numbers for ease of understanding. The specific operations of similar elements, which are already discussed in detail in above paragraphs, are omitted herein for the sake of brevity.

Compared with FIG. 7, the memory device 80 further includes a main control circuit 720 and an input/output circuit 730. For illustration, the main control circuit 720 and the input/output circuit 730 are arranged in a row adjacent to a row in which the word line decoder 110 and two groups G1-G2 are located. Alternatively stated, the main control circuit 720 and the input/output circuit 730 are arranged adjacent the word line decoder 110, while specifically the control circuit 720 is located between two groups (of memory segments) G1-G2.

In some embodiments, the main control circuit 720 is configured to transmit the aforementioned address ADR to the word line decoder 110. The input/output circuit 730 is configured to transmit data from/to the memory segments, such like memory segments 201-203. Accordingly, in some embodiments, the word line decoder 110, the main control circuit 720 and the input/output circuit 730 are configured to co-operate to perform memory operation, such like read operation or write operation, to memory cells included in the memory device 80.

The configurations of FIG. 8 are given for illustrative purposes. Various implements are within the contemplated scope of the present disclosure. For example, in some embodiments, the memory device 80 includes a plurality of memory segments arranged on the other side, with respect to the word line decoder 110, of the main control circuit 720, in which the configurations of the memory segments are the same as that of the memory segments shown in FIG. 7.

Figure 9:
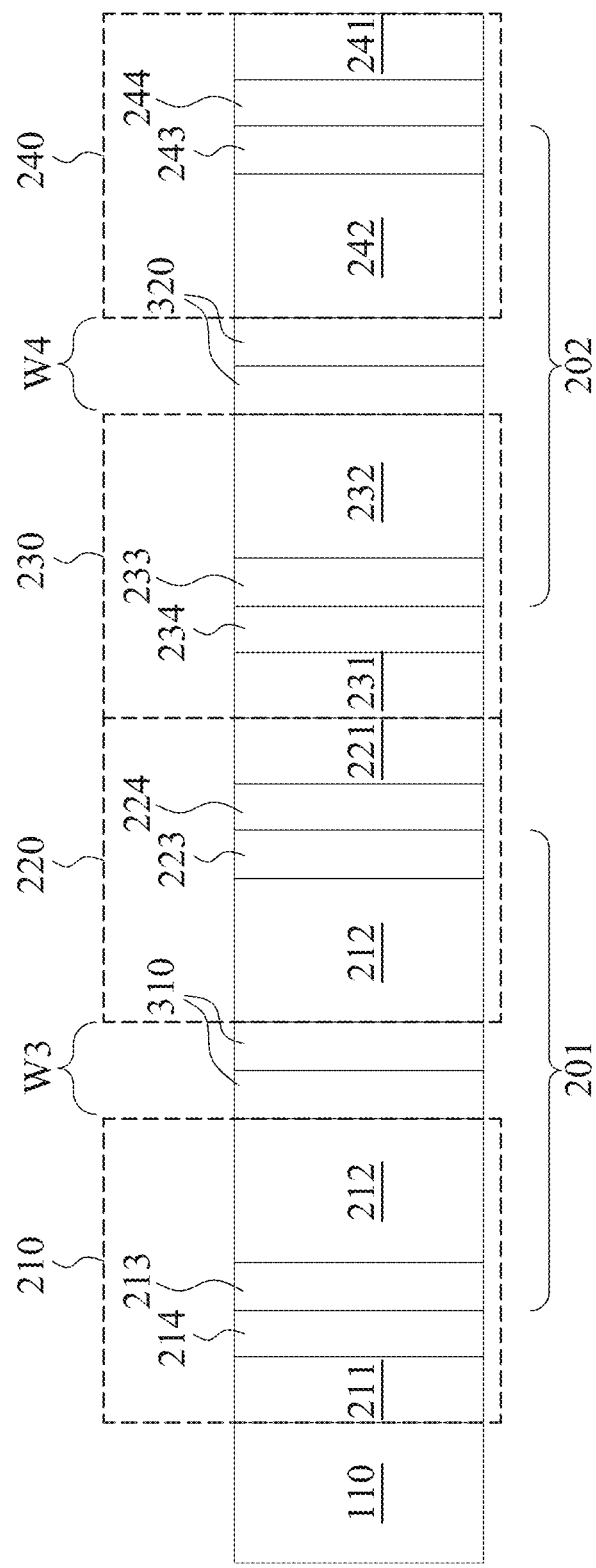
FIG. 9 is a schematic diagram of a floor plan of a memory device, in accordance with some embodiments.
Figure 9:
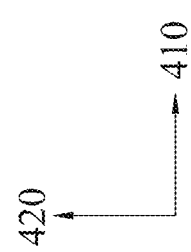

Reference is now made to FIG. 9. FIG. 9 is a schematic diagram of a floor plan of a memory device 90, in accordance with some embodiments. With respect to the embodiments of FIGS. 1-8, like elements in FIG. 9 are designated with the same reference numbers for ease of understanding.

Compared with FIG. 4, instead of the isolation cell 310 having the width W1, the isolation cell 310 included in the memory device 90 includes 2 columns of edge cell arrays (i.e., each one column configured to be the same as the edge cell array 213) and has a width W3. Similarly, instead of the isolation cell 320 having the width W1, the isolation cell 320 included in the memory device 90 includes 2 columns of edge cell arrays (i.e., each one column configured to be the same as the edge cell array 233) and has a width W4. In some embodiments, the widths W3 and W4 are the same with each other. In various embodiments, the widths W3 and W4 are different from each other.

The configurations of FIG. 9 are given for illustrative purposes. Various implements are within the contemplated scope of the present disclosure. For example, in some embodiments, the isolation cell 310 in the memory device 90 includes more than two columns of edge cell arrays.

Figure 10:
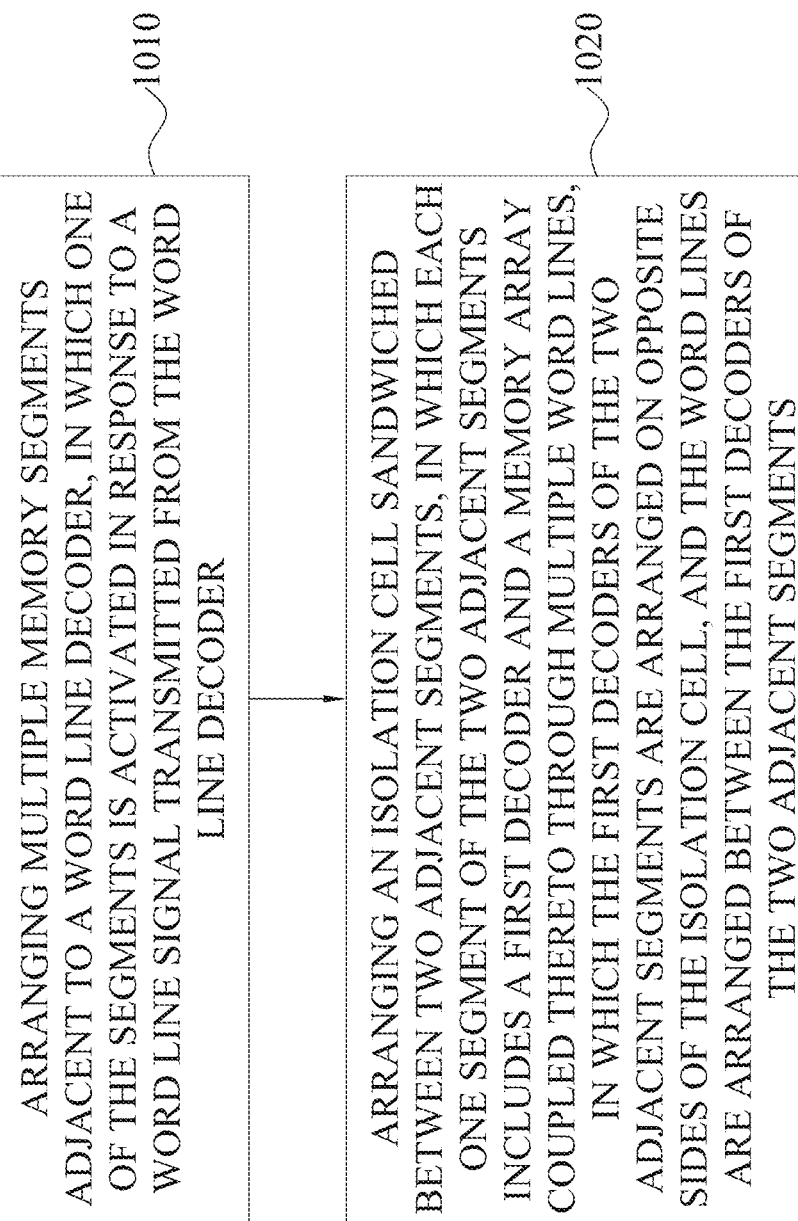
FIG. 10 is a flow chart of a method of fabricating a memory device, in accordance with some embodiments.

Reference is now made to FIG. 10. FIG. 10 is a flow chart of a method of fabricating a memory device 10, 40, 70, 80, or 90, in accordance with some embodiments. It is understood that additional operations can be provided before, during, and after the processes shown by FIG. 11, and some of the operations described below can be replaced or eliminated, for additional embodiments of the method. The order of the operations/processes may be interchangeable. Throughout the various views and illustrative embodiments, like reference numbers are used to designate like elements. The method 1000 includes operations 1010-1020 that are described below with reference to the memory device 70 in FIG. 7.

In operation 1010, as shown in FIG. 7, the memory segments 210-250 are arranged adjacent to the word line decoder 110, in which one of the memory segments 210-250 is activated in response to the word line signal GWLB transmitted from the word line decoder 110.

In some embodiments, as the embodiments shown in FIG. 7, the memory segments of the first group and the memory segments of the second group are arranged on opposite sides of the word line decoder cell 110, and the amounts of memory segments included in the first group and the second group are different. For example, the first group includes two memory segments, and the second group includes three memory segments.

In operation 1020, an isolation cell is arranged sandwiched between two adjacent memory segments. For instance, the isolation cell 310 is arranged sandwiched between two adjacent memory segments 210-220 of the memory segment 210-250. Each of the two adjacent memory segments 210-220 includes one of the decoders 211 and 221 and one of the memory arrays 212 and 222 to which several word lines are coupled. The decoders 211 and 221 in the memory segments 210-220 are arranged on the opposite sides of the isolation cell 310, and the word lines WL_1_0-WL_1_$n$ and WL_2_0-WL_2_$n$ are arranged between the decoders 211 and 221, as shown in FIG. 3A.

In some embodiments, as shown in FIG. 7, another memory segment 250, of the memory segments 210-250, abutting one two adjacent segments 230-240 includes the decoder (cell) 251, in which the decoder cell 241 and the decoder cell 251 abut one another.

Figure 11:
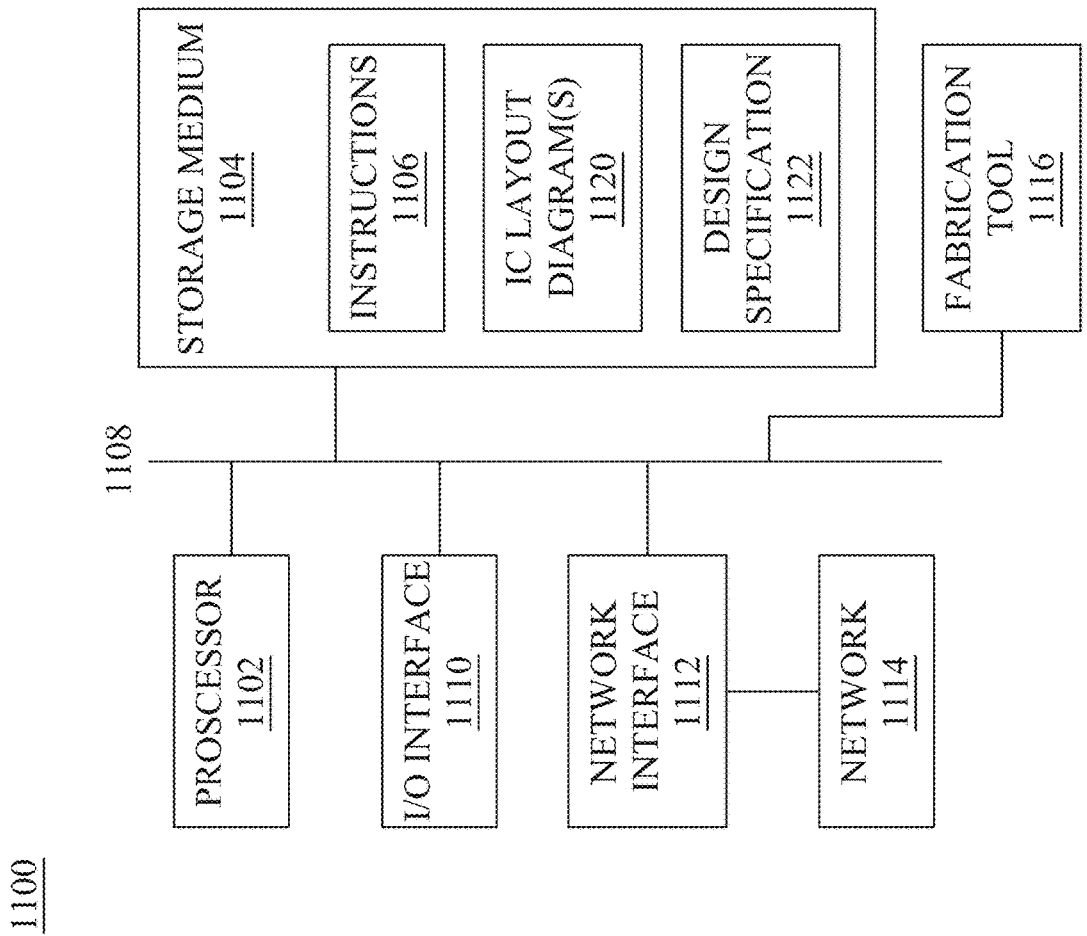
FIG. 11 is a block diagram of a system for designing the integrated circuit layout design, in accordance with some embodiments of the present disclosure.

Reference is now made to FIG. 11. FIG. 11 is a block diagram of an electronic design automation (EDA) system 1100 for designing the integrated circuit layout design, in accordance with some embodiments of the present disclosure. EDA system 1100 is configured to implement one or more operations of the method 1000 disclosed in FIG. 10, and further explained in conjunction with FIGS. 1-9. In some embodiments, EDA system 1100 includes an APR system.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code (instructions) 1106, i.e., a set of executable instructions. Execution of instructions 1106 by hardware processor 1102 represents (at least in part) an EDA tool which implements a portion or all of, e.g., the method 1000.

The processor 1102 is electrically coupled to computer-readable storage medium 1104 via a bus 1108. The processor 1102 is also electrically coupled to an I/O interface 1110 and a fabrication tool 1116 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. The processor 1102 is configured to execute computer program code 1106 encoded in computer-readable storage medium 1104 in order to cause EDA system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause EDA system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores IC layout diagram 1120 of standard cells including such standard cells as disclosed herein, for example, a cell including in the memory devices 10, 40, 70, 80 and/or 90 discussed above with respect to FIGS. 1-9.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows EDA system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1164. In one or more embodiments, a portion or all of noted processes and/or methods, is implemented in two or more systems 1100.

EDA system 1100 also includes the fabrication tool 1116 coupled to processor 1102. The fabrication tool 1116 is configured to fabricate integrated circuits, e.g., the memory devices 10, 40, and 70-90 illustrated in FIGS. 1-9, according to the design files processed by the processor 1102.

EDA system 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as design specification 1122.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 12:
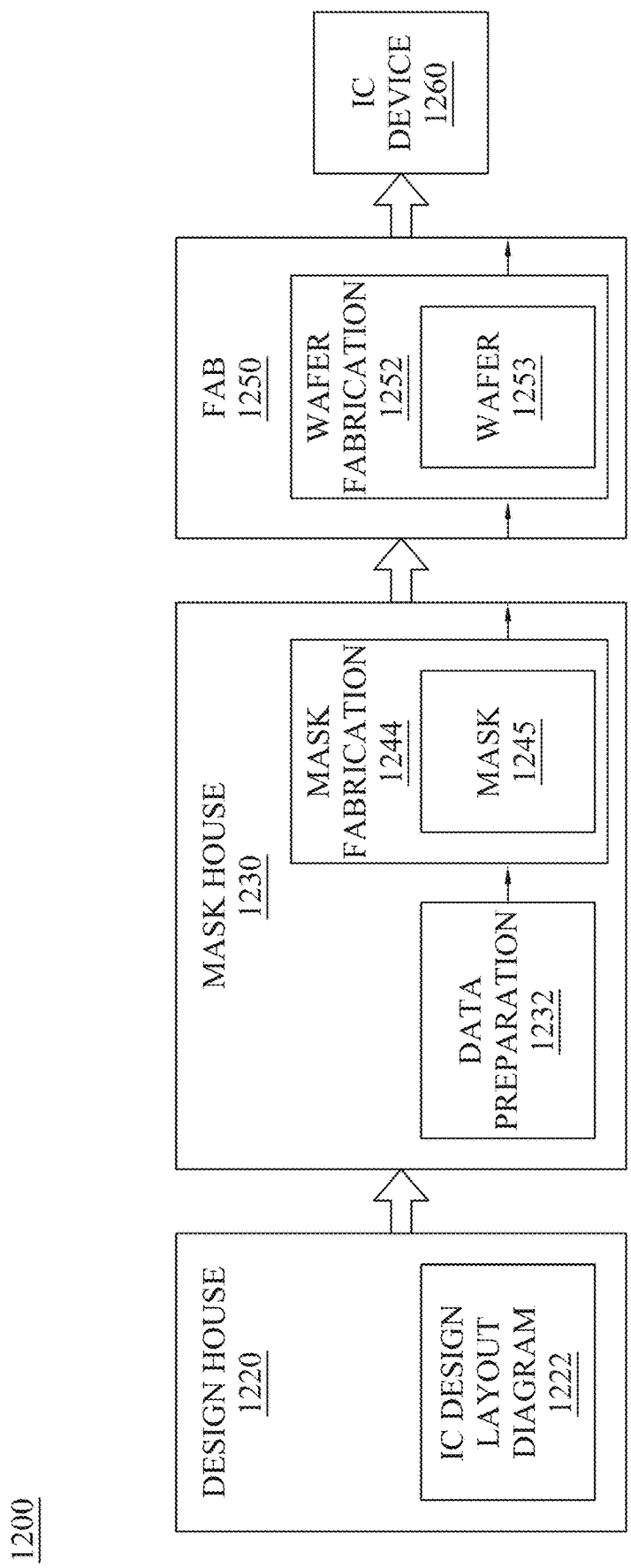
FIG. 12 is a block diagram of an integrated circuit manufacturing system, and an integrated circuit manufacturing flow associated therewith, in accordance with some embodiments.

FIG. 12 is a block diagram of IC manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in IC manufacturing system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns, for example, an IC layout design depicted in FIGS. 1-9, designed for an IC device 1260, for example, memory devices 10, 40, and 70-90 discussed above with respect to FIGS. 1-9. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The IC design layout diagram 1222 is manipulated by mask data preparation 1232 to comply with particular characteristics of the mask writer and/or requirements of IC fab 1250. In FIG. 12, data preparation 1232 and mask fabrication 1244 are illustrated as separate elements. In some embodiments, data preparation 1232 and mask fabrication 1244 can be collectively referred to as mask data preparation.

In some embodiments, data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of data preparation 1232 has been simplified for the purposes of clarity. In some embodiments, data preparation 1232 includes additional features such as a logic operation (LOP)

to modify the IC design layout diagram 1222 according to manufacturing rules. Additionally, the processes applied to IC design layout diagram 1222 during data preparation 1232 may be executed in a variety of different orders.

After data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1245 includes a transparent substrate (for example, fused quartz) and an opaque material (for example, chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 includes wafer fabrication 1252. IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

As described above, memory arrays included in the memory device of the present disclosure are configured to be arranged back-to-back, and isolation cells are sandwiched between the adjacent memory segments. Accordingly, the area used for edge cells and necessary blank space is reduced, the efficiency of area of the memory device rises to further reduce the cost of manufacture processes.

In some embodiments, an memory device includes a first isolation cell, a first memory array of a first memory segment, a second memory array of a second memory segment, a first decoder cell of the first memory segment and a second decoder cell of the second memory segment. The first isolation cell extends in a first direction. The first memory array of the first memory segment abuts a first boundary of the first isolation cell in a second direction different from the first direction. The second memory array of the second memory segment abuts a second boundary, opposite to the first boundary, of the first isolation cell in the second direction. The first decoder cell of the first memory segment and the second decoder cell of the second memory segment are arranged on opposite sides of the first isolation cell. In some embodiments, the memory device further includes a first edge cell array of the first memory segment abutting a boundary, opposite to the first isolation cell, of the first memory array of the first memory segment; and a second edge cell array of the second memory segment abutting a boundary, opposite to the first isolation cell, of the second memory array of the second memory segment. In some embodiments, the memory device further includes multiple edge cell arrays that abut the first memory array of the first memory segment and the second memory array of the second memory segment. The first isolation cell includes a number N of the edge cell arrays, in which N is a positive integer. In some embodiments, the number N equals 2. In some embodiments, the memory device further includes a third memory array of a third memory segment, a fourth memory array of a fourth memory segment, a second isolation cell, a third decoder cell of the third memory segment and a fourth decoder cell of the fourth memory segment. The second isolation cell is arranged interposed between and abuts the third memory array of the third memory segment and the fourth memory array of a fourth memory segment. The third decoder cell of the third memory segment and the fourth decoder cell of the fourth memory segment are arranged on opposite sides of the second isolation cell. The third decoder cell of the third memory segment abut the second decoder cell of the second memory segment in the second direction. In some embodiments, the memory device further includes a first edge cell array and a second edge cell array. The first edge cell array abuts the second memory array of the second memory segment, and the second edge cell array abuts the third memory array of the third memory segment. The third decoder cell of the third memory segment and the second decoder cell of the second memory segment are arranged interposed between the first edge cell array and the second edge cell array. In some embodiments, the memory device further includes a third memory array of a third memory segment, a third decoder cell of the third memory segment, and a word line decoder cell. The second decoder cell of the second memory segment and the third decoder cell of the third memory segment abut two opposite boundaries of the word line decoder cell. In some embodiments, the memory device further includes a second isolation cell, a fourth memory array of a fourth memory segment, a fourth decoder cell of the fourth memory segment, a fifth decoder cell of a fifth memory segment and a fifth memory array of the fifth memory segment. The third memory array of the third memory segment abuts a first boundary of the second isolation cell. The fourth memory array of the fourth memory segment abuts a second boundary, opposite to the first boundary, of the second isolation cell. The third decoder cell of the third memory segment and the fourth decoder cell of the fourth memory segment are arranged on opposite sides of the second isolation cell. The fourth decoder cell of the fourth memory segment and the fifth decoder cell of the fifth memory segment abut each other and are arranged between the fourth memory array of the fourth memory segment and the fifth memory array of the fifth memory segment. In some embodiments, the memory device further includes multiple first word lines and multiple second word lines. The first word lines extend from the first decoder cell to the first memory array of the first memory segment. The second word lines extend from the second decoder cell to the second memory array of the second memory segment. The first word lines and the second word lines are terminated at the first isolation cell. In some embodiments, the first memory array of the first memory segment includes multiple memory cells arranged in multiple rows and multiple columns, and the first isolation cell includes multiple edge cells. The memory cells and multiple edge cells have the same structural configuration.

Also disclosed is a memory device that includes a first memory bank. The first memory bank includes multiple first edge cells, multiple first memory cells, multiple second edge cells, multiple third edge cells and multiple first word lines. The first edge cells are arranged in at least one first edge column of multiple memory columns. The first memory cells are arranged in a first set of the memory columns. An edge column in the first set of the memory columns is right adjacent to the at least one first edge column of the memory columns. The second edge cells are arranged in a second set of the memory columns and multiple second memory cells arranged in a third set of the memory columns. The second edge cells are sandwiched between the first memory cells and the second memory cells. The third edge cells are arranged in at least one second edge column of the memory columns. An edge column in the third set of the memory columns is right adjacent to the at least one second edge column of the memory columns. The first word lines are coupled to the first memory cells and multiple second word lines coupled to the second memory cells. The first word lines and the second word lines are terminated at the second set of the memory columns. In some embodiments, the memory device further includes a first decoder coupled to the first word lines and a second decoder coupled to the second word lines. The first decoder and the second decoder are arranged on opposite sides of the first memory bank. In some embodiments, the memory device further includes a first decoder and a second decoder. The first decoder transmits, on a first side of the first memory bank, multiple first word line signals to the first word lines to activate one of plurality of first memory cells. The second decoder transmits, on a second side different from the first side of the first memory bank, multiple second word line signals to the second word lines to activate one of plurality of second memory cells. In some embodiments, the first edge cells and the first memory cells are arranged, with respect to the second edge cells, in a mirror configuration of the third edge cells and the second memory cells. In some embodiments, the memory device further includes a second memory bank. The first memory bank and the second memory bank include the same configuration. The first memory bank and the second memory bank are symmetric with respect to a word decoder interposed therebetween. In some embodiments, the memory device further includes multiple first memory banks and a word line decoder. The word line decoder is coupled to the first memory banks, wherein a number of a first group in the first memory banks arranged on a first side of the word line decoder is the same as a number of a second group in the first memory banks arranged on a second side, different from the first side, of the word line decoder.

Also disclosed is a memory device that includes multiple memory segments and an isolation cell. The memory segments are arranged adjacent to a word line decoder. One of the memory segments is activated in response to a word line signal transmitted from the word line decoder. The isolation cell is arranged sandwiched between two adjacent segments of the memory segments. Each one segment of the two adjacent segments includes a first decoder and a memory array coupled thereto through multiple word lines. The first decoders of the two adjacent segments are arranged on opposite sides of the isolation cell, and the word lines are arranged between the first decoders of the two adjacent segments. In some embodiments, a first group of the memory segments are arranged on a first side of the word line decoder. A second group of the memory segments are arranged on a second side, different from the first side, of the word line decoder. A first number of the memory segments in the first group and a second number of the plurality of memory segments in the second group are different from each other. In some embodiments, the first number is an odd number, and the second number is an even number. In some embodiments, the first decoder of one of the two adjacent segments is arranged in a first decoder cell. Another segment, abutting the one of the two adjacent segments, of the memory segments includes a second decoder arranged in a second decoder cell. The first decoder cell and the second decoder cell abut with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a first isolation cell extending in a first direction;
 a first memory array of a first memory segment abutting a first boundary of the first isolation cell in a second direction different from the first direction;
 a second memory array of a second memory segment abutting a second boundary, opposite to the first boundary, of the first isolation cell in the second direction;
 a first decoder cell of the first memory segment and a second decoder cell of the second memory segment that are arranged on opposite sides of the first isolation cell;
 a plurality of first word lines extending from the first decoder cell to the first memory array of the first memory segment; and
 a plurality of second word lines extending from the second decoder cell to the second memory array of the second memory segment,
 wherein the plurality of first word lines and the plurality of second word lines are terminated at the first isolation cell.

2. The memory device of claim 1, further comprising:
a first edge cell array of the first memory segment abutting a boundary, opposite to the first isolation cell, of the first memory array of the first memory segment; and
a second edge cell array of the second memory segment abutting a boundary, opposite to the first isolation cell, of the second memory array of the second memory segment.

3. The memory device of claim 1, further comprising:
a plurality of edge cell arrays that abut the first memory array of the first memory segment and the second memory array of the second memory segment;
wherein the first isolation cell includes a number N of the plurality of edge cell arrays, in which N is a positive integer.

4. The memory device of claim 3, wherein the number N equals 2.

5. The memory device of claim 1, further comprising:
a third memory array of a third memory segment and a fourth memory array of a fourth memory segment;
a second isolation cell which is arranged interposed between and abuts the third memory array of the third memory segment and the fourth memory array of the fourth memory segment; and
a third decoder cell of the third memory segment and a fourth decoder cell of the fourth memory segment that are arranged on opposite sides of the second isolation cell, wherein the third decoder cell of the third memory segment abuts the second decoder cell of the second memory segment in the second direction.

6. The memory device of claim 5, further comprising:
a first edge cell array and a second edge cell array, wherein the first edge cell array abuts the second memory array of the second memory segment, and the second edge cell array abuts the third memory array of the third memory segment;
wherein the third decoder cell of the third memory segment and the second decoder cell of the second memory segment are arranged interposed between the first edge cell array and the second edge cell array.

7. The memory device of claim 1, further comprising:
a third memory array of a third memory segment and a third decoder cell of the third memory segment; and
a word line decoder cell, wherein the second decoder cell of the second memory segment and the third decoder cell of the third memory segment abut two opposite boundaries of the word line decoder cell.

8. The memory device of claim 7, further comprising:
a second isolation cell, wherein the third memory array of the third memory segment abuts a first boundary of the second isolation cell;
a fourth memory array of a fourth memory segment abutting a second boundary, opposite to the first boundary, of the second isolation cell;
a fourth decoder cell of the fourth memory segment, wherein the third decoder cell of the third memory segment and the fourth decoder cell of the fourth memory segment are arranged on opposite sides of the second isolation cell; and
a fifth decoder cell of a fifth memory segment and a fifth memory array of the fifth memory segment, wherein the fourth decoder cell of the fourth memory segment and the fifth decoder cell of the fifth memory segment abut each other and are arranged between the fourth memory array of the fourth memory segment and the fifth memory array of the fifth memory segment.

9. The memory device of claim 1, wherein the first memory array of the first memory segment includes a plurality of memory cells arranged in a plurality of rows and a plurality of columns, and the first isolation cell includes a plurality of edge cells,
wherein the plurality of memory cells and the plurality of edge cells have the same structural configuration.

10. A memory device, comprising:
a first memory bank, comprising:
a plurality of first edge cells arranged in at least one first edge column of a plurality of memory columns;
a plurality of first memory cells arranged in a first set of the plurality of memory columns, wherein an edge column in the first set of the plurality of memory columns is right adjacent to the at least one first edge column of the plurality of memory columns;
a plurality of second edge cells arranged in a second set of the plurality of memory columns and a plurality of second memory cells arranged in a third set of the plurality of memory columns, wherein the plurality of second edge cells are sandwiched between the plurality of first memory cells and the plurality of second memory cells;
a plurality of third edge cells arranged in at least one second edge column of the plurality of memory columns, wherein an edge column in the third set of the plurality of memory columns is right adjacent to the at least one second edge column of the plurality of memory columns; and
a plurality of first word lines coupled to the plurality of first memory cells and a plurality of second word lines coupled to the plurality of second memory cells, wherein the plurality of first word lines and the plurality of second word lines are terminated at the second set of the plurality of memory columns.

11. The memory device of claim 10, further comprising:
a first decoder coupled to the plurality of first word lines and a second decoder coupled to the plurality of second word lines, wherein the first decoder and the second decoder are arranged on opposite sides of the first memory bank.

12. The memory device of claim 10, further comprising:
a first decoder configured to transmit, on a first side of the first memory bank, a plurality of first word line signals to the plurality of first word lines to activate one of plurality of first memory cells; and
a second decoder configured to transmit, on a second side different from the first side of the first memory bank, a plurality of second word line signals to the plurality of second word lines to activate one of plurality of second memory cells.

13. The memory device of claim 10, wherein the plurality of first edge cells and the plurality of first memory cells are arranged, with respect to the plurality of second edge cells, in a mirror configuration of the plurality of third edge cells and the plurality of second memory cells.

14. The memory device of claim 10, further comprising:
a second memory bank, wherein the first memory bank and the second memory bank include the same configuration, and
the first memory bank and the second memory bank are symmetric with respect to a word decoder interposed therebetween.

15. The memory device of claim 10, further comprising:
a plurality of the first memory banks; and
a word line decoder coupled to the plurality of the first memory banks, wherein a number of a first group in the plurality of the first memory banks arranged on a first side of the word line decoder is the same as a number of a second group in the plurality of the first memory banks arranged on a second side, different from the first side, of the word line decoder.

16. A memory device, comprising:
a plurality of memory segments arranged adjacent to a word line decoder, wherein one of the plurality of memory segments is configured to be activated in response to a word line signal transmitted from the word line decoder; and
an isolation cell arranged sandwiched between two adjacent segments of the plurality of memory segments,
wherein each one segment of the two adjacent segments includes a first decoder and a memory array coupled thereto through a plurality of word lines,
wherein the first decoders of the two adjacent segments are arranged on opposite sides of the isolation cell, and the plurality of word lines are arranged between the first decoders of the two adjacent segments.

17. The memory device of claim 16, wherein a first group of the plurality of memory segments are arranged on a first side of the word line decoder, and
a second group of the plurality of memory segments are arranged on a second side, different from the first side, of the word line decoder;
wherein a first number of the plurality of memory segments in the first group and a second number of the plurality of memory segments in the second group are different from each other.

18. The memory device of claim 17, wherein the first number is an odd number, and the second number is an even number.

19. The memory device of claim 16, wherein the first decoder of one of the two adjacent segments is arranged in a first decoder cell;
wherein another segment, abutting the one of the two adjacent segments, of the plurality of memory segments includes a second decoder arranged in a second decoder cell,
wherein the first decoder cell and the second decoder cell abut with each other.

20. The memory device of claim 1, further comprising:
a second isolation cell; and
a third memory array of a third memory segment and a fourth memory array of a fourth memory segment that abut opposite boundaries of the second isolation cell respectively.

* * * * *